United States Patent [19]
Tabata et al.

[11] Patent Number: 6,154,862
[45] Date of Patent: Nov. 28, 2000

[54] DEFECT ANALYSIS MEMORY FOR MEMORY TESTER

[75] Inventors: Makoto Tabata, Chichibu; Shinya Sato, Gyoda, both of Japan

[73] Assignee: Advantest Corporation, Tokyo, Japan

[21] Appl. No.: 09/091,931

[22] PCT Filed: Oct. 29, 1997

[86] PCT No.: PCT/JP97/03928

§ 371 Date: Jun. 24, 1998

§ 102(e) Date: Jun. 24, 1998

[87] PCT Pub. No.: WO98/20498

PCT Pub. Date: May 14, 1998

[30] Foreign Application Priority Data

Nov. 1, 1996 [JP] Japan ................................. 8-291400

[51] Int. Cl.[7] ................................................ G11C 29/00
[52] U.S. Cl. ................................................ 714/719; 714/42
[58] Field of Search .......................... 714/720, 3, 25, 714/719, 42

[56] References Cited

U.S. PATENT DOCUMENTS

| | | | |
|---|---|---|---|
| 4,293,950 | 10/1981 | Shimizu et al. | 714/743 |
| 4,958,346 | 9/1990 | Fujisaki | 714/720 |
| 5,173,906 | 12/1992 | Dreibelbis et al. | 714/733 |
| 5,287,363 | 2/1994 | Wolf et al. | 714/718 |
| 5,530,805 | 6/1996 | Tanabe | 714/42 |
| 5,691,945 | 11/1997 | Liou et al. | 365/200 |
| 5,790,559 | 8/1998 | Sato | 714/720 |

FOREIGN PATENT DOCUMENTS

| | | | |
|---|---|---|---|
| 55-28118 | 2/1980 | Japan | G06F 11/00 |
| 4-318398 | 11/1992 | Japan | G11C 29/00 |
| 5-242695 | 9/1993 | Japan | G11C 29/00 |
| 7-130199 | 5/1995 | Japan | G11C 29/00 |

OTHER PUBLICATIONS

Ng, et al., Maintaining Goog Performance in Disk Arrays During Failure via Uniform Parity Distribution, 1992, IEEE.
Ghoniemy, et al., A Microcomputer–based Automatic Testing System for Digital Circuits Using Signature Analysis, 1996, IEEE.
Anderson, et al., Challenges for IC Failure Anaylsis–Present and Future, 1995, IEEE.
Horst, Reliable Design of High–Speed Cache and Control Store Memories, 1989, IEEE.
English–language translation of International Search Report for Patent Application No. PCT/JP/97/03928.

*Primary Examiner*—Albert De Cady
*Assistant Examiner*—Guy Lamarre
*Attorney, Agent, or Firm*—Gallagher & Lathrop; David N. Lathrop

[57] ABSTRACT

In a failure analysis memory for memory testing apparatus which has a failure data storage part composed of a failure data memory and a first memory control part and a mask data storage part composed of a mask data memory and a second memory control part, when the logical comparison result by the testing apparatus is a failure in the test mode, the first memory control part effects control to generate write enable data and write failure data in the failure data memory at the corresponding address and, in the remove mode, effects control to read out failure data from the failure data memory and provide it to the mask data storage part. In the test mode the second memory control part effects control to provide mask data read out of the mask data memory, as an inhibit signal, to a logic comparator of the memory testing apparatus to inhibit it from making a logical comparison and, in the remove mode, the second memory control part effects control to generate a write enable signal from the failure data read out of the failure data memory and apply it to the mask data memory to write therein mask data at the corresponding address.

8 Claims, 7 Drawing Sheets

FIG. 4 PRIOR ART

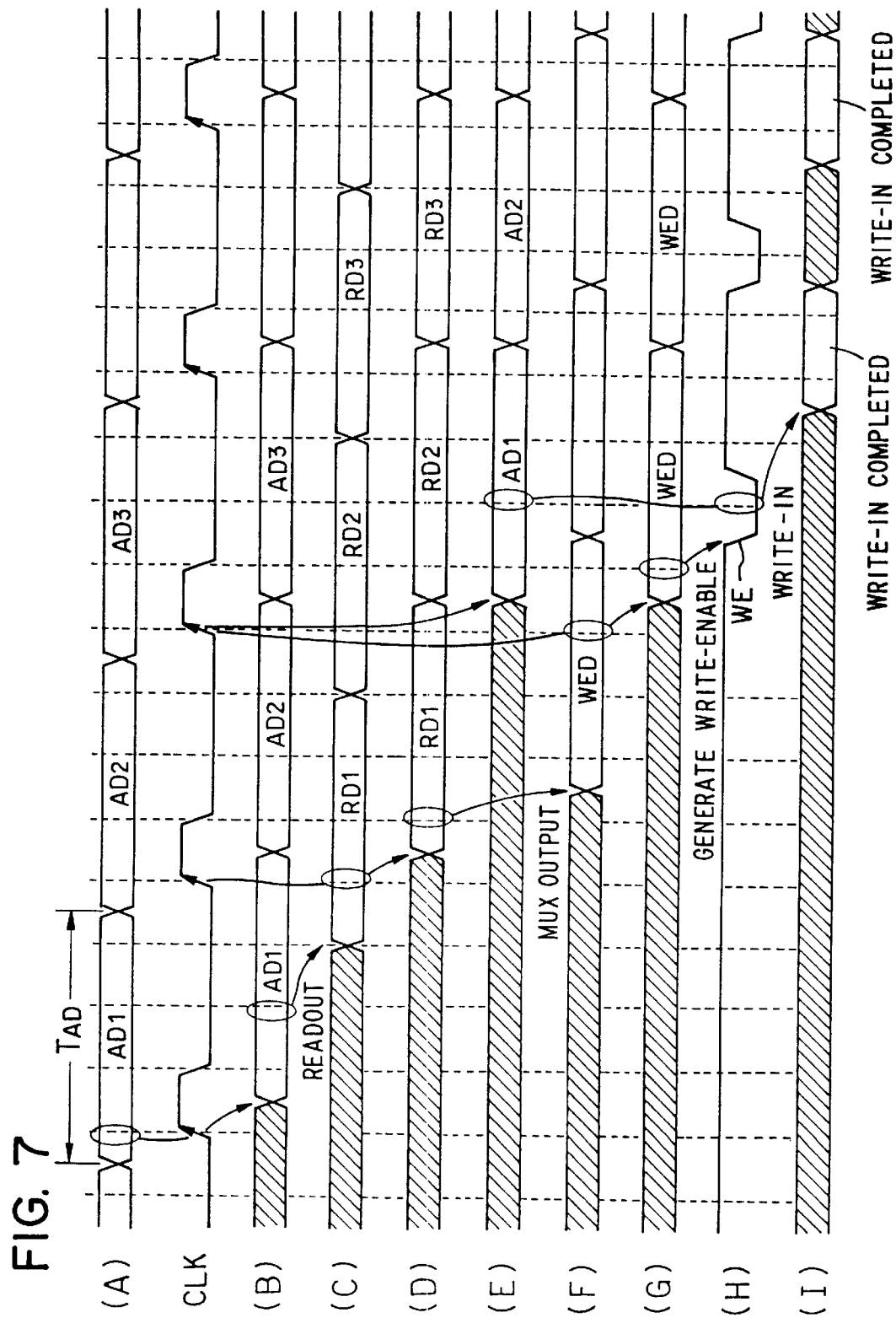

DEFECT ANALYSIS MEMORY FOR MEMORY TESTER

BACKGROUND OF THE INVENTION

1. Field of the Invention

The present invention relates to a failure analysis memory for semiconductor memory testing apparatus and, more particularly, to a failure analysis memory for memory testing apparatus which speeds up what is called a remove operation and hence reduces the time for testing semiconductor memories

2. Description of the Prior Art

Referring first to FIG. 1, a prior art example of memory testing apparatus will be described in brief.

In the testing of semiconductor memories, a pattern generator 20 responds to a reference clock CLK from a timing generator 10 to generate an address AD, test data TD, expectation data ED and a control signal CS. The address AD, the test data TD and the control signal CS are each shaped by a formatter 30 into a waveform necessary for testing, thereafter being applied to a memory under test 60. The memory under test 60 is controlled by the control signal CS so that the test data TD is written in the address AD or read out therefrom. The data RD read out of the address AD of the memory under test 60 is fed to a logic comparator 40, wherein it is compared with the expectation data ED from the pattern generator 20 for a match or mismatch therebetween to determine if the memory under test 60 is defective or nondefective. The mismatch is stored as failure data FD in a failure analysis memory 50 at the corresponding address AD. After the test, the contents of the failure analysis memory 50 are checked to analyze failing addresses of the memory under test 60.

Turning next to FIG. 2, a description will be given of how to use the failure analysis memory 50 in the test of semiconductor memories.

In general, the memory testing apparatus is designed to conduct a memory test in various modes; in one of such test modes, the memory is tested in three steps under test conditions (such as the test cycle or period, timing and the test voltage) of gradually increasing severity and the test results are analyzed for each step. In FIG. 2 there are shown examples of test results obtained on the memory 60 in the respective steps. Assume that the test conditions become more stringent in order of TEST1-TEST2-TEST3. Accordingly, when a certain address fails for the first time under some test conditions, it will also fail in subsequent tests under more stringent conditions. Reference numerals A0 to A7 denote addresses of the memory under test 60 and FD indicates that a mismatch is detected, at the address concerned, between the expectation data ED from the pattern generator 20 and the read-out data RD from the memory 60.

TEST1 indicates that the memory 60 is defective at the address A2. TEST2 indicates that the addresses A2 and A6 are defective, but it cannot be judged from TEST2 alone which address, A2 or A6, failed due to changes in the test conditions. Moreover, it is impossible to judge whether the addresses A2 and A6 are both decided as defective under the test conditions of TEST2. From TEST3 it can be judged that the addresses A2, A6 and A7 are defective, but it cannot be decided, either, which address failed because of having changed the test conditions to those of TEST3. In other words, the test conclusions on the address that failed in the previous test need to be ignored in the next test under severer conditions.

To meet this requirement, it is conventional to test the memory 60 at each stage after clearing the contents of the failure analysis memory 50 and then inhibiting the write therein of the comparison results on the address having failed in the previous test (i.e. inhibiting the logical comparison). To perform this, a failure data storage part and a mask data storage part are provided in the failure analysis memory 50 as described later on; upon completion of the test at each stage, failure data FD detected and written in the failure data storage part in the failure analysis memory 50 at that stage is written in the mask data storage part, inhibiting the logical comparison in the next test at the address for which the failure data has been written in the mask data storage part. The processing by which the failure data read out of the failure analysis memory is written in the mask data storage part at the corresponding address to generate the mask data is called a remove operation.

A description will be given, with reference to FIG. 3, of the generation of mask data by the remove operation. FIG. 3 shows states SF1, SF2 and SF3 of the failure data storage part 5A after the tests TEST1, TEST2 and TEST3 and states SM1 and SM2 of the mask data storage part 5B prior to the tests TEST1 and TEST2 in the failure analysis memory 50.

Prior to the start of the test TEST2, failure data stored in the failure data storage part 5A is written intact in a mask data storage part 5B which outputs data INH for inhibiting the logical comparison by the logical comparator 40. The state of the mask data storage part 5B at this time is the state SM1 in FIG. 3. As the result of this, a pass/fail decision on the address A2 written "MSK" is inhibited in the next test. Then, the data written in the memory under test 60 and the failure data in the failure data storage part 5A are erased, after which the test TEST2 is conducted. In TEST2, the logical comparator 40 provides information that the addresses A2 and A6 of the memory under test 60 are defective in this example, but the failure data about the address A2 is inhibited from being written in the failure data storage part 5A by the mask data MSK in the state SM1 of the mask data storage part 5B that inhibits the logical comparison on the address A2, and consequently, only the information that the address A6 is defective is stored in the failure data storage part 5A. The failure data storage part 5A is placed in state SF2 at this time.

Prior to the start of the test TEST3, too, the failure data in the failure data storage part 5A is similarly written in the mask data storage part 5B that generates the data INH for inhibiting the pass/fail decision by the logic comparator 40. At this time, however, it is necessary to rewrite or update the contents of the mask data storage part 5B by writing thereinto mask data on the address A6 having newly failed in TEST2 while maintaining the mask data on the address A2 for which the pass/fail decision was inhibited in TEST2. This is the afore-mentioned remove operation. The reason for this processing is that since TEST3 is intended to locate which address fails under test conditions severer than in TEST2, it is necessary to inhibit the pass/fail decision on the addresses having failed in TEST2 and TEST1 under test conditions less stringent than in TEST3. That is, the mask data storage part 5B enters the state SM2 in which to output information that inhibits the pass/fail decision on the address A2 in the state SM1 and information that inhibits the pass/fail decision corresponding to the failure of the address A6 in the state SM2. Next, the failure data stored in the failure data storage part 5A is erased, after which the test TEST3 is conducted. In TEST3, the failure data storage part 5A is placed in the state SF3 due to the mask data in the state SM2.

As a result, the place or address where the memory under test failed in TEST2 under test conditions severer than in TEST1 can be analyzed by reading out the contents of the failure data storage part 5A of the state SF2; likewise, the place or address where the memory under test failed in TEST3 under test conditions more stringent than in TEST2 can also be analyzed by reading out the contents of the failure data storage part 5A of the state SF3.

Turning next to FIG. 4, an example of the configuration of the conventional failure analysis memory 50 will be described.

The failure analysis memory 50 comprises an address select part 51, a mode select part 52 and two blocks 5A and 5B. The address select part 51 is made up of an address pointer 512 that generates an address in a remove mode of operation and an address multiplexer 511 that selectively outputs either one of the address from the address pointer 512 and the address from the pattern generator 20. In the illustrated example, from the viewpoints of efficiency in design and fabrication and general versatility, the block 5A containing a failure data memory 57A and the block 5B containing a mask data memory 57B have exactly the same construction so that during the test the block 5A, for instance, is used as a failure data storage part and the other block 5B as a mask data storage part.

The block 5A includes: a write enable generator 531A which generates write enable data; a multiplexer 532A which selects either one of the failure data FD from the logic comparator 40 and the write enable data in accordance with the setting of a mask mode register 52A of the mode select part 52; the failure data memory 57A; an OR circuit 535A by which, when the block 5B acts as a failure data storage part, data read out of the failure data memory 57A is ORed with failure data read out of the other block 5B operating as a failure data storage part; and a multiplexer 533A which selects either one of the output from the OR circuit 535A and logic "H" and provides it as mask data to the failure data memory 57A. Flip-flops 54A, 55A and 56A are used to delay data by a desired time interval and hold it. A shaper 534A shapes the write enable data, provided thereto from the multiplexer 532A via a flip-flop 536A, into a write enable signal of a proper width and timing for input into the failure data memory 57A.

The following description will be given on the assumption that the block 5A is used as the failure data storage part and the block 5B as the mask data storage part. Accordingly, the decision result (failure data) FD from the logic comparator 40 is input into the multiplexer 532A in the block 5A but it need not be fed to a multiplexer 532B in the block 5B. The mask data read out of the mask data memory 57B in the block 5B during the test is provided as an inhibit signal INH to the logic comparator 40 via a flip-flop 55B.

(a) Test Mode

In the test mode a remove mode register 521 and mask mode registers 52A and 52B are set at "L." By this, the address multiplexer 511 selects the address from the pattern generator 20 and provides it to the flip-flops 54A and 54B in the blocks 5A and 5B, specifying addresses in the failure data memory 57A and the mask data memory 57B, respectively. At this time, the multiplexer 532B in the block 5B is selecting its terminal A, but since the terminal A is being opened, the "L" output is provided; therefore, the mask data memory 57B is not supplied with the write enable signal via a flip-flop 536B and a shaper 534B and hence remains in a read mode. Consequently, mask data is read out of the mask data memory 57B and provided as the inhibit signal INH to the logic comparator 40 via the flip-flop 55B. When the inhibit signal INH is "H," the logical comparison by the logic comparator 40 is inhibited. When the inhibit signal INH is "L," the comparison result FD is selected by the multiplexer 532A in the block 5A and provided as the write enable signal to the failure data memory 57A via the flip-flop 536A and the shaper 534A. Accordingly, when INH="L" and FD="H," the "H" logic provided to the input terminal A of the multiplexer 533A is written in the failure data memory 57A at its specified address. When INH="H," the logic comparator 40 is inhibited from making the logical comparison, and hence FD="L" and no write is effected in the failure data memory 57A. As the result of this, based on the failure data FD on the address where the memory under test 60 has failed for the first time in the previous test, "H" logic is written in the corresponding address of the failure data memory 57A in the block (the failure data storage part) 5A.

Upon completion of the above test mode, an analysis is made of the address of the memory under test 60 that has failed for the first time in the test, and then the remove mode described below is executed to generate mask data for the subsequent test.

(b) Remove Mode

In this mode, "H" logic is set in the remove mode register 521 and the multiplexer 511 selects the output address from the address pointer 512 and provides it to the flip-flops 54A and 54B. On the other hand, "L" and "H" logic are set in the mask mode registers 52A and 52B, respectively. The address pointer 512 sequentially generates all addresses that are provided to the failure data memory 57A and the mask data memory 57B in common to them. The block 5A is not supplied with the failure data FD as the write enable data but instead data is read out of the failure data memory 57A at addresses sequentially specified by the address pointer 512 and held in the flip-flop 55A, from which the data is provided to an OR circuit 535B in the block (the mask data storage part) 5B. The mask data memory 57B in the block 5B is also read out at the same address and at the same timing as in the block 5A and the read-out mask data is held in the flip-flop 55B. The read-out mask data held in the flip-flop 55B is provided therefrom to the OR circuit 535B, wherein it is Ored with the read-out data from the failure data memory 57A in the block 5A, and the OR output is selected by a multiplexer 533B and held in a flip-flop 56B as mask data to be written. The write enable generator 531A generates write enable data so that the write enable signal for writing the mask data in the mask data memory 57B is applied to a write enable terminal /we of the mask data memory 57B at proper timing.

In the remove mode, as indicated in the states SF2 and SM2 in FIG. 3, for instance, the failure data on the address A6 having failed for the first time in the test, written in the failure data memory 57A in the block 5A is written as mask data in the mask data memory 57B at the corresponding address A6 via the OR circuit 535B in the block 5B and the mask data (data on the address A2) held so far in the block 5B (the mask data storage part) is written again in the same address (A2) via the OR circuit 535B.

Upon completion of data transfer from the failure data memory 57A to the mask data memory 57B in the remove mode, the contents of the failure data memory 57A in the block 5a and the contents of the memory under test 60 are cleared, after which the next test is conducted.

FIG. 5 is a timing chart showing the states of signals occurring at places (A) through (K) in FIG. 4 when the remove operation is performed using the block 5A in FIG. 4 as the failure data storage part of FIG. 3 and the block 5B as the mask data storage part. In FIG. 5, Row (A) shows addresses AD1, AD2, . . . from the address pointer 512 and Rows (B) and (E) respectively show data output via the flip-flops 54A and 54B to access the failure data memory 57A and the mask data memory 57B by the addresses from the address pointer 512. Rows (C) and (F) show the data RD read out of the failure data memory 57A and the mask data memory 57B, respectively, and Rows (D) and (G) the data RD output via the flip-flops 55A and 55B.

In the remove mode, since mask data is created which inhibits pass/fail decisions in the next test on the address for which the pass/fail decision has been inhibited and on the address which has newly failed in the current test, it is necessary that data (H), which is the OR of the data (D) and (G) read out of the same address, for example, AD1 of the failure data memory 57A and the mask data memory 57B, be newly written in the mask data memory 57B at the same address AD1. Since the block 5B is operated as the mask data storage part, the data (H) is provided as the output signal (I) from the multiplexer 533B and it is output as a signal (J) via the flip-lop 56B. The signal (J) is data that is newly written in the mask data memory 57B at the address AD1. This data is written in the mask data memory 57B by write enable data (K) generated by the write enable generator 531B.

As shown in FIG. 4, the address AD1 of the mask data memory 57B in which the above write is effected is the address (E) held in the flip-flop 54B. That is, in the conventional remove mode the address (E) in the flip-flop 54B needs to be held AD1 until after completion of three cycles of reading out data from every address of the failure and mask data memories 57A and 57B, ORing the read-out data and writing the OR data in the mask data memory 57B. The remove operation on the next address AD2 can be performed before only after the end of the write cycle.

In recent years, memories to be tested have become increasingly large-capacity as typified by DRAMs; the failure analysis memory for analyzing failures of such large-capacity memories are also made large in capacity correspondingly. Since the above-mentioned remove operation also involves a sequence of steps for each address, the time for remove operation also increases with an increase in the memory capacity. With this being the situation, it is important in the reduction of the memory testing time how to shorten the remove operation time.

Incidentally, the sequence of remove operations for creating the mask data consists of three cycles, i.e. the memory readout cycle, the data combining (ORing) cycle and the memory write cycle as indicated by the period TAD on Row (A) in FIG. 5, and since data is read out of and written in the memory at the same address during the three cycles, the value of the address pointer must be held all the while.

SUMMARY OF THE INVENTION

It is therefore an object of the present invention to provide a failure analysis memory for memory testing apparatus which speeds up the remove operation and hence permits reduction of the time for testing semiconductor memories.

According to the present invention, there is provided a failure analysis memory for memory testing apparatus wherein: in a test mode for each of steps of testing a memory under stepwise varied test conditions through utilization of test data, an address and expectation data generated by a pattern generator, the test data is written in the memory under test at the said address, data read out therefrom is compared by a logic comparator with the expectation data, and the comparison result is written in the failure analysis memory at the corresponding address to analyze a failure of the memory under test, the failure analysis memory being masked at an address corresponding to that of the memory under test which has failed in the previous test; and in a remove mode, mask data is newly created for the failure analysis memory in preparation for writing therein the comparison result in the next test. The failure analysis memory comprises a failure data storage part and a mask data storage part. The failure data storage part is made up of: a failure data memory having a data input terminal supplied with a predetermined logical level; and a first memory control part which effect control so that, in the test mode, a write enable signal is generated in accordance with the comparison result and the predetermined logical level is written as failure data in the failure data memory at the corresponding address and that, in the remove mode, the failure data is read out from the failure data memory. The mask data storage part is made up of: a mask data memory having a data input terminal supplied with a predetermined logical level; and a second memory control part which effects control so that, in the test mode, mask data is read out of the mask data memory at an address corresponding to the address from the pattern generator and is provided as an inhibit signal to the logic comparator to inhibit it from making a logical comparison at that address and that, in the remove mode, the failure data read out from the failure data memory is applied as a write enable signal to the mask data memory to write therein the logical level as mask data at the corresponding address.

BRIEF DESCRIPTION OF THE DRAWINGS

FIG. 4 is a block diagram showing the configuration of a conventional failure analysis memory;

FIG. 7 is a timing chart showing the remove operation of the FIG. 6 embodiment.

DETAILED DESCRIPTION OF THE PREFERRED EMBODIMENT

A description will be given, with reference to FIG. 6, of the mode for carrying out the present invention.

Figure 1:
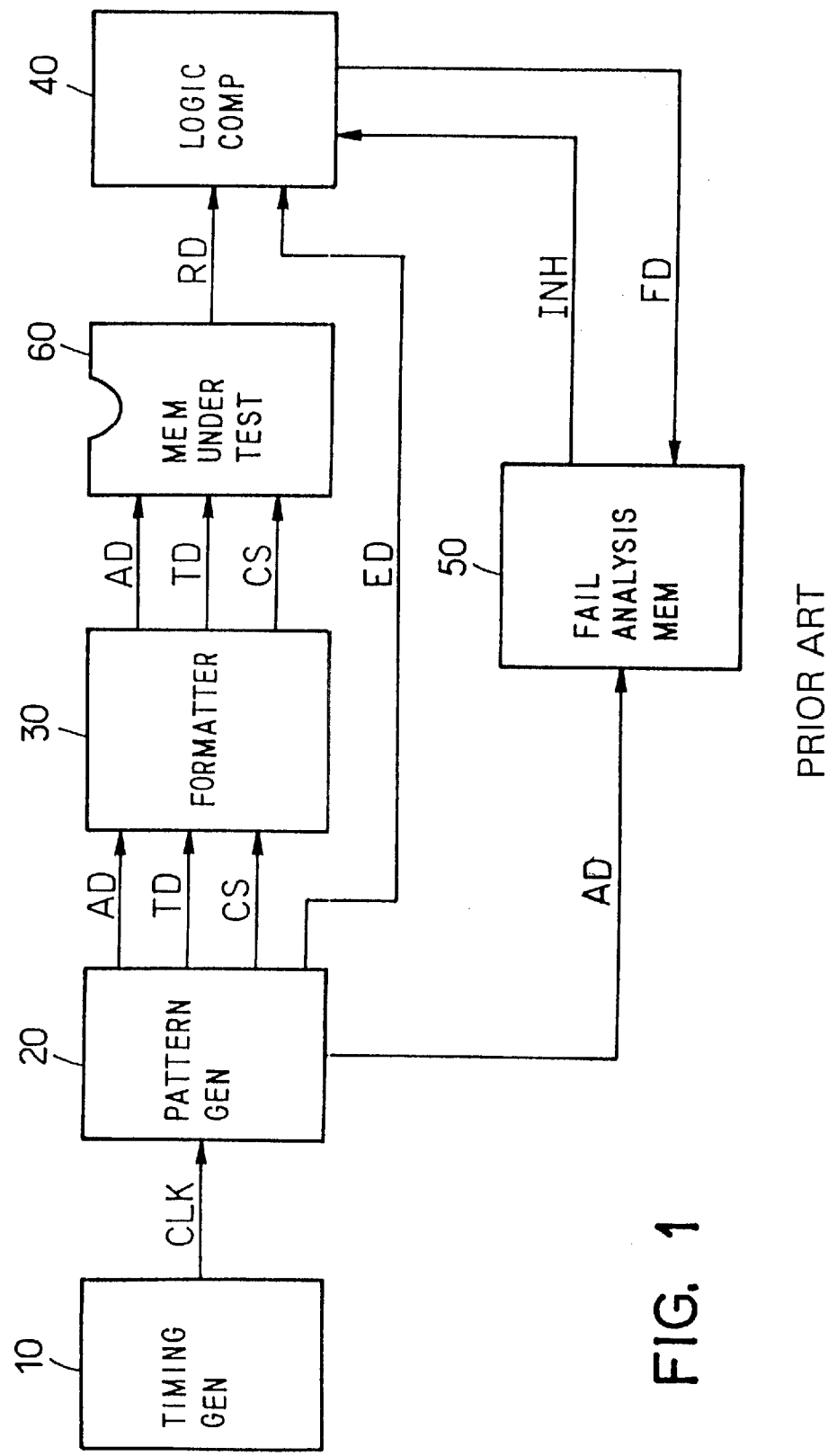
FIG. 1 is a block diagram illustrating the configuration of a common memory testing apparatus.
Figure 2:
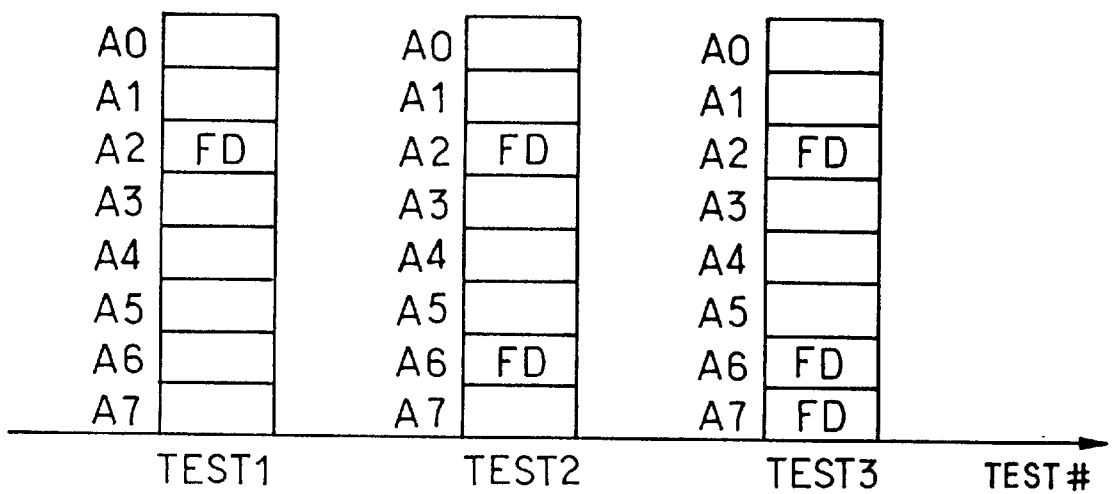
FIG. 2 is a diagram showing the state of data written in a failure analysis memory as the result of each memory test under a different test condition.
Figure 3:
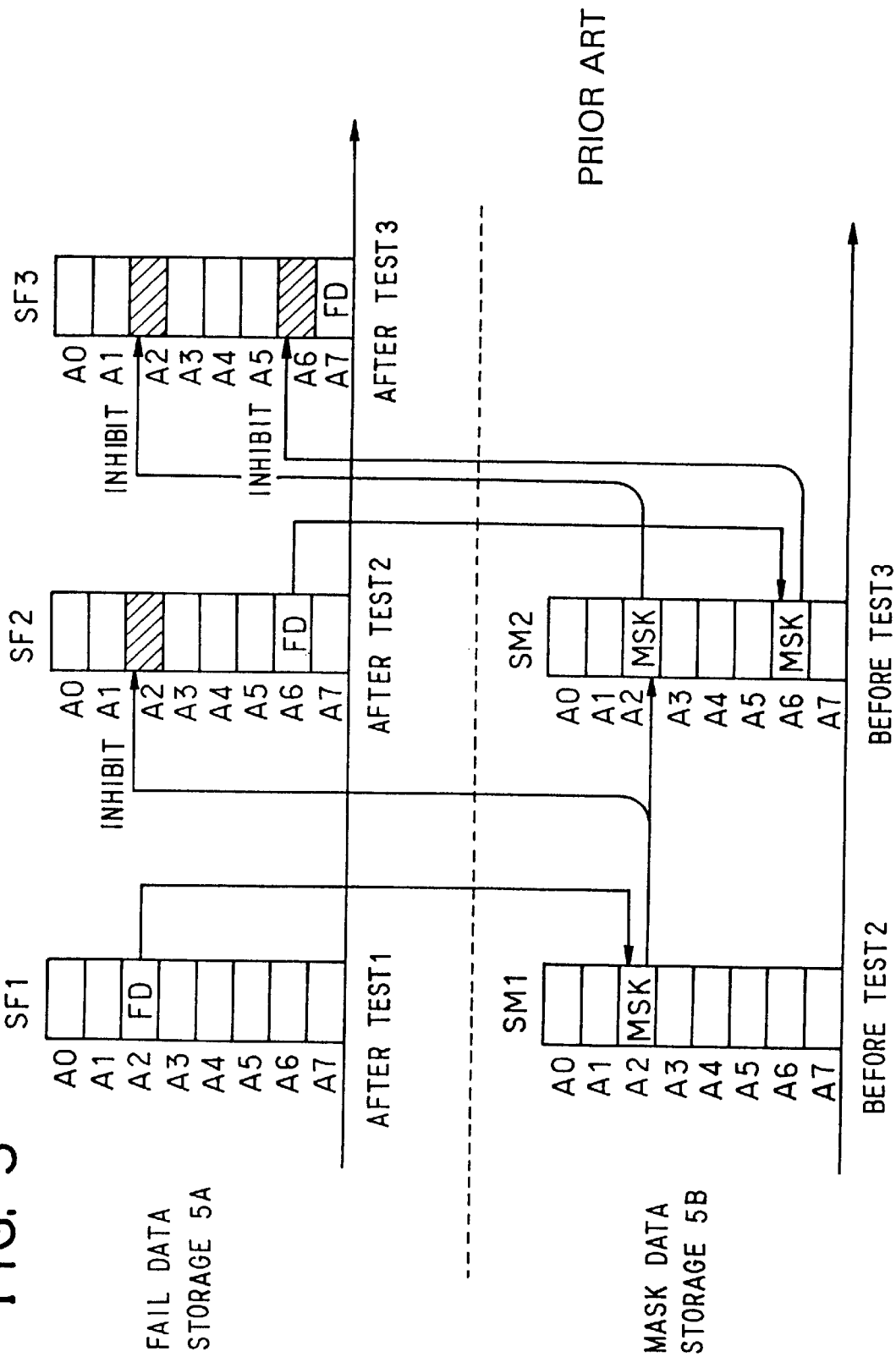
FIG. 3 is a diagram showing the states of a failure data storage part and a mask data storage part in the failure analysis memory at the end of each test.
Figure 6:
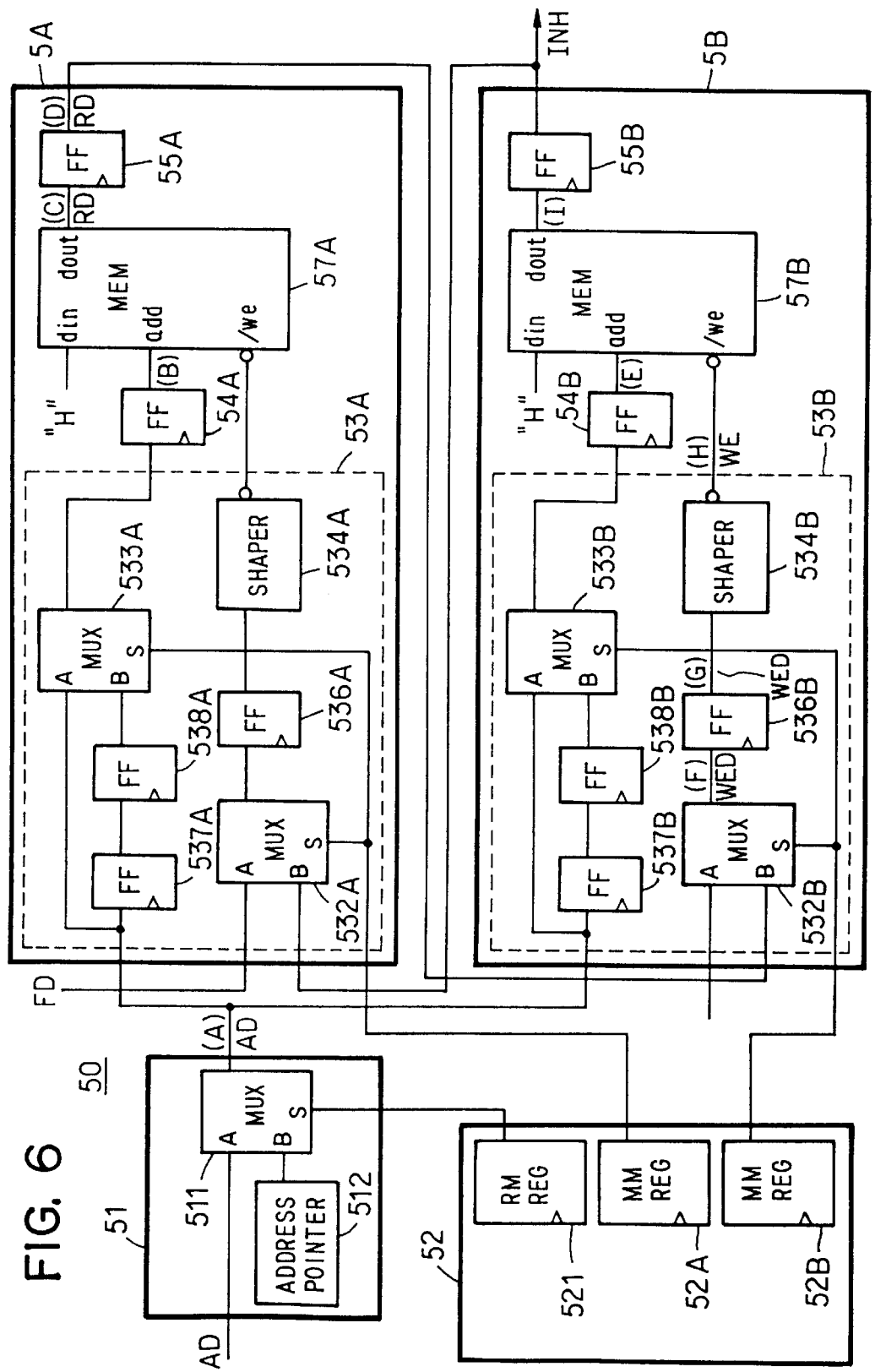
FIG. 6 is a block diagram illustrating the failure analysis memory according to the present invention.

FIG. 6 illustrates in block form an embodiment of the failure analysis memory, indicated generally by 50, according to the present invention for use in such a memory testing apparatus as shown in FIG. 1. The use of the failure analysis memory 50 according to the present invention permits reduction of the remove operation time. The failure analysis memory of this embodiment differs from the conventional failure analysis memory in the circuit configurations of the memory control parts 53A and 53B and in the circuit configurations for data input into the failure data memory 57A and the mask data memory 57B.

Figure 4:
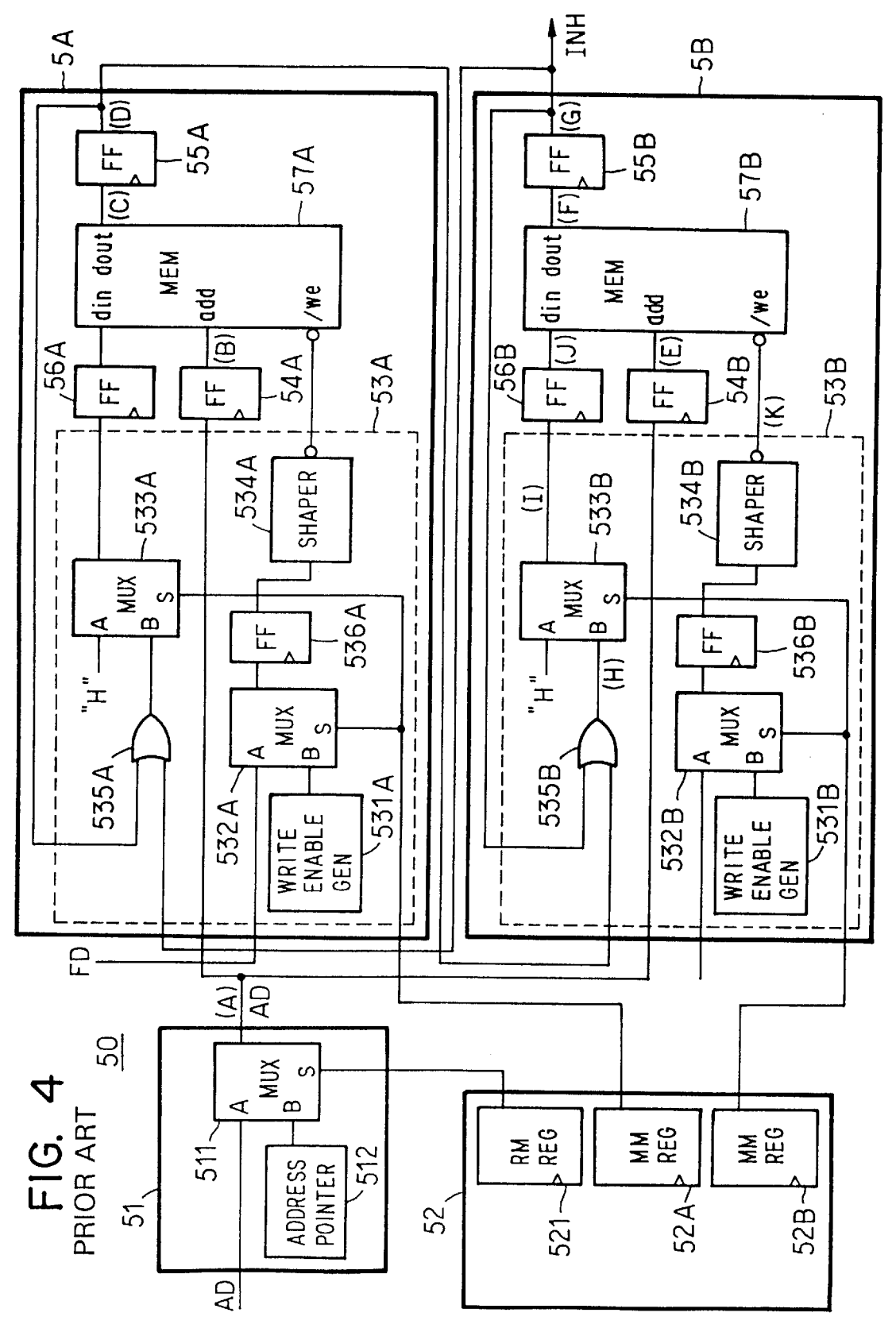

As is the case with FIG. 4, the failure analysis memory 50 comprises the address select part 51, the mode select part 52 and the two blocks 5A and 5B of the same configuration. The address select part 51 and the mode select part 52 are identical in construction with those in FIG. 4. The block 5A is made up of the memory control part 53A, the failure data memory 57A and the flip-flops 54A and 55A. In this embodiment, too, the blocks 5A and 5B have the same construction and can be used as either of the failure data storage part and the mask data storage part. The memory control part 53A comprises the multiplexer 532A for selecting write enable data, the flip-flop 536A for holding and delaying the write enable data, the shaper 534A, flip-flops 537A and 538A for delaying the timing of the address from the address select part 51, and the multiplexer 533A for selecting either one of the delayed address and the undelayed one. The block 5B also has the same construction as that of the block 5A.

By setting "L" in the mask mode register 52A, the multiplexer 532A select its input terminal A which is supplied with the failure data FD from the logic comparator 40 (FIG. 1) and the multiplexer 533A selects its input terminal A which is supplied with the undelayed address. As a result, the block 5A operates as the failure data storage part. On the other hand, by setting "H" in the mask register 52B, the multiplexer 532B in the block 5B selects its input terminal B which is supplied with data read out from the failure data memory 57A in the block 5A and the multiplexer 533B selects its input terminal B which is supplied with the address delayed by the flip-flops 537B and 538B. As a result, the block 5B functions as the mask data storage part.

Test Mode

According to the present invention, too, in the memory test mode, "L" is set in the remove mode register 521, by which the address multiplexer 511 is caused to select the terminal A to which the address AD is provided from the pattern generator 20. By setting "L" in the mask mode register 52B, too, the terminals A of the multiplexers 532A and 533A are selected. On the other hand, "L" is also set in the mask mode register 52B to select the terminal A of the multiplexer 533B to which the undelayed address is input. The multiplexer 532B also selects the terminal A, but since the terminal A is open, no write enable signal is applied, and consequently, the mask data memory 57B is in the read mode. The mask data read out of the mask data memory 57B is provided as the inhibit signal INH to the logic comparator 40 via the flip-flop 55B.

The failure data FD, which is output from the logic comparator 40 while not supplied with the inhibit signal INH (i.e. INH=0), is selected by the multiplexer 532A and provided as a write enable signal to the failure data memory 57A via the flip-flop 536A and the shaper 534A, with the result that "H" at its data input terminal din is written in the failure data memory 57A at the address held in the flip-flop 54A.

At the end of the logical comparison test on all addresses of the memory under test, there is written failure data in the failure data storage part 5A at the address that failed for the first time in the current stage of test, and the written data is used to make the necessary failure analysis. Prior to the test of the next stage, the following remove mode is carried out.

Remove Mode

In the remove mode, by setting "H" in the remove mode register 521, the multiplxer 511 is caused to select the terminal B to which the address from the address pointer 512 is input. The mask mode register 52A is still set at "L," but since the logic comparator 40 is not in operation, no data is provided to the terminal A of the multiplexer 532A and no write enable signal is generated. That is, the failure data memory 57A is in the read mode. On the other hand, "H" is set in the mask mode register 52B, by which the multiplexer 53B selects the terminal B to which the data read out of the failure data memory 57A is provided. Hence, if the data read out of the failure data memory 57A is "H" indicating a failure, the data is fed as a write enable signal WE to the mask data memory 57B via the flip-flop 536B and the shaper 534B, so that "H" provided to its data input terminal $d_{in}$ is written as mask data in the mask data memory 57B at the address held in the flip-flop 54B at that time. When the data that is provided from the failure data memory 57A to the terminal B of the flip-flop 532B is "L," the write enable signal WE does not go "H," and consequently, "H" is not written in the mask data memory 57B. In this way, for each of the addresses provided from the address pointer 512 one after another, failure data FD written in the failure data memory 57A of the failure data storage part 5A is read out therefrom and written in the mask data memory 57B of the mask data storage part 5B at the corresponding address. Upon completion of the remove mode, the contents of the failure data memory 57A of the failure data storage part 5A are cleared and the memory test of the next step is conducted in the same manner as described above.

Figure 5:
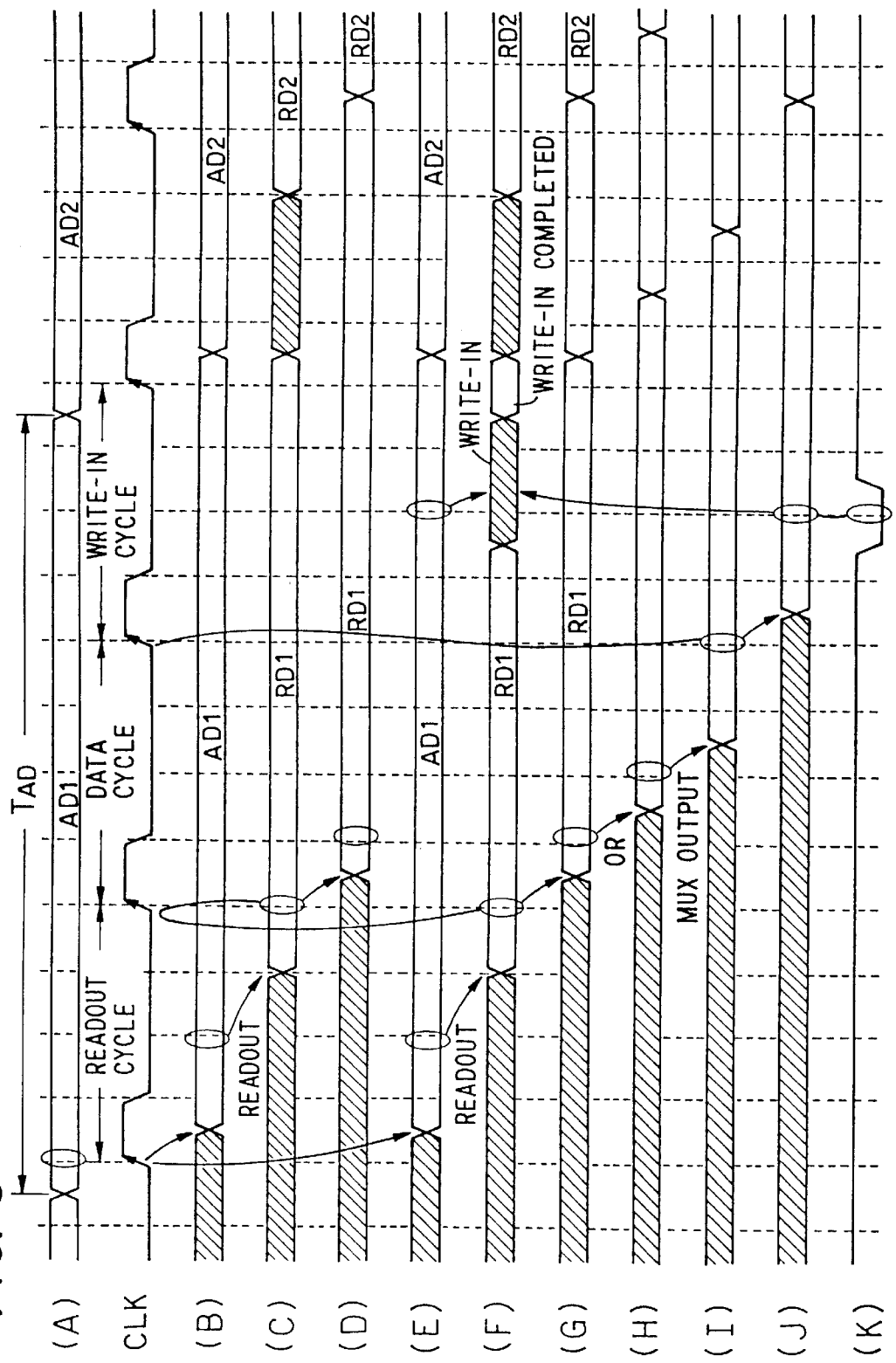
FIG. 5 is a timing chart showing a remove operation of the failure analysis memory depicted in FIG. 4.

In the above-described remove mode, the write enable signal for the mask data memory 57B is produced only when the failure data FD is read out from the failure data memory 57A; hence, "L" is not written in the mask data memory 57B of the mask data storage part 5B but instead "H" is written therein based on the read-out failure data FD. Accordingly, there is no need for the conventional processing of reading out the contents of the mask data memory 57B of the mask data storage part 5B and ORing the read-out data with the failure data FD read out of the failure data memory 57A. Furthermore, since the conventional failure analysis memory performs, for each address, reading out of the mask data memory 57B and writing of the OR in the failure data memory (see FIG. 5, Row (F)), the address value of the address pointer 512 needs to be held until the end of the sequence of operations. However, since the failure analysis memory according to the present invention does not perform the readout of the mask data memory 57B in the remove mode, the address needs only to be provided to the mask data memory 57B during the failure data write period and one clock period is enough for this period. Accordingly, it is possible to update the address in the address pointer 512 with the period of the clock CLK.

FIG. 7 is a timing chart showing the states of signals occurring at the places indicated by (A) to (I) in FIG. 6.

Row(A) shows the addresses AD1, Ad2, . . . that are output from the address pointer 512. Rows (B) and (E) show addresses that are output via the flip-flops 54A and 54B to access the failure data memory 57A of the failure data storage part 5A and the mask data memory 57B of the mask data storage part 5B at the addresses provided from the address pointer 512. The address on Row (B) is one that is provided by delaying the address of Row (A) through one stage of flip-flop 54A since the failure data memory 57A of the failure data storage part 5A is selecting the terminal A of the multiplexer 533A in response to the setting of the mask mode register 52A. The address on Row (E) is one that is provided by delaying the address of Row (A) through three stages of flip-flops 537B, 538B and 54B since the mask data memory 57B of the mask data storage part 5B is selecting the terminal B of the multiplexer 533B in response to the setting of the mask mode register 52B. Row (C) shows data RD1, RD2, . . . that are read out from the failure data memory 57A of the failure data storage part 5A by the use of the address of Row (B), and Row (D) shows data RD1, RD2, . . . that are obtained by delaying the data of Row (C) by the flip-flop 55A.

As described previously, the remove operation according to the present invention uses, as the write enable signal for the mask data storage part 5B, the data RD1, RD2, . . . of Row (D) read out from the failure data storage part 5A. That is, since the multiplexer 532B selects its terminal B in response to the setting of the mask mode register 52B, the data RD of Row (D) read out from the failure data storage part 5A is output as write enable data WED of Row (F). The data obtained by delaying this write enable data by the flip-flop 536B is write enable data WED shown on Row (G). The write enable data WED of Row (G) is converted by the shaper 534B into a write enable signal WE of proper timing and width for effecting a write in the mask data memory 57B and is output as a write enable signal WE shown on Row (H). The write in the mask data memory 57B is effected by providing the address of Row (E) and the write enable signal WE of Row (H) to the mask data memory 57B, and the write in the mask data memory 57B ends at the timing indicated by "WRITE-IN COMPLETED" on Row (I).

In the remove operation of the conventional failure analysis memory, as described previously, data read out of the failure data memory 57B at a certain address is ORed with data read out of the mask data memory 57B at the corresponding address and the OR data is written in the mask data memory 57B at the address from which the above-mentioned data was read out. In contrast to this, the failure analysis memory reads out the failure data memory 57A at a certain address and generates the write enable signal WE for the mask data memory 57B when the read-out data is "H" indicating a failure. The mask data memory 57B is always supplied with "H" at its input data terminal din and mask data is written in the mask data memory 57B when the "H" data RD read out of the failure data memory 57A is applied thereto as the write enable signal.

EFFECT OF THE INVENTION

As described above, the traditional remove operation effects a write in the mask data memory 57B through utilization of write enable data that is generated by the write enable generator 531B every three clocks, and hence it requires three cycles consisting of a memory readout cycle, read-out data combining (ORing) cycle and a memory write cycle. On the other hand, since the remove operation according to the present invention uses, as the write enable data, the failure data read out of the failure data storage part 5A, the ORing of data is not necessary, and consequently, there is no need of reading-out of the mask data memory 57B. Therefore, the remove operation can be achieved in one cycle for each address. This permits substantial reduction of the time for the remove operation.

What is claimed is:

1. A failure analysis memory for memory testing apparatus wherein: in a test mode for each of steps of testing a memory under stepwise varied test conditions through utilization of test data, an address and expectation data generated by a pattern generator, said test data is written in said memory under test at said address, data read out therefrom is compared by a logic comparator with said expectation data, the comparison result is written in said failure analysis memory at the corresponding address to analyze a failure of said memory under test, said failure analysis memory being masked at an address corresponding to that of said memory under test that has failed in the previous test; and in a remove mode, mask data is newly created for said failure analysis memory in preparation for writing therein the comparison result in the next test, said failure analysis memory comprising:

a failure data storage part, and a mask data storage part;

wherein said failure data storage part comprises: a failure data memory having a data input terminal supplied with a predetermined logical level; and a first memory control part which effect control so that, in said test mode, a write enable signal is generated in accordance with said comparison result and said predetermined logical level is written as failure data in said failure data memory at the corresponding address and that, in said remove mode, said failure data is read out from said failure data memory; and wherein said mask data storage part comprises: a mask data memory having a data input terminal supplied with a predetermined logical level; and a second memory control part which effects control so that, in said test mode, mask data is read out of said mask data memory at an address corresponding to said address from said pattern generator and is provided as an inhibit signal to said logic comparator to inhibit it from making a logical comparison at that address and that, in said remove mode, said failure data read out from failure data memory is applied as a write enable signal to said mask data memory to write therein said logical level as mask data at the corresponding address.

2. The failure analysis memory of claim 1, further comprising: an address pointer which generates an address for accessing said failure data memory and said mask data memory; and an address multiplexer which selects the address from said pattern generator in said test mode and the address from said address pointer in said remove mode, for providing said selected address to said failure data memory and said mask data memory in common to them.

3. The failure analysis memory of claim 2, further comprising a remove mode register for holding information that sets said address multiplexer to select said address from said pattern generator in said test mode and said address from said address pointer in said remove mode.

4. The failure analysis memory of claim 1 or 2, wherein said second memory control part comprises address delay means which delays said address by a predetermined time interval to output a delayed address, and a delay multiplexer which selects said address provided thereto directly in said test mode and said delayed address in said remove mode, for outputting it as an address to be provided to said mask data.

5. The failure analysis memory of claim 4, wherein said second memory control part further comprises a data multiplexer which has an open input terminal and an input terminal supplied with failure data read out from said failure data memory in said remove mode and which selects said open input terminal in said test mode and said failure data input terminal in said remove mode so that said write enable signal is applied to said mask data memory to put it in a write mode when said failure data is at a predetermined logical level and that when said failure data is not at said predetermined logical level, said mask data memory is in a readout mode.

6. The failure analysis memory of claim 5, further comprising a mask mode register for holding information that sets said delay multiplexer and said data multiplexer so that said delay multiplexer selects and outputs said address provided thereto directly in said test mode and that, in said remove mode, said delay multiplexer selects said delayed address from said delay means and said data multiplxer selects failure data read out of said failure data memory.

7. The failure analysis memory of claim 5, wherein said first memory control part comprises a comparison result multiplexer which selects said comparison result from said logic comparator in said test mode and provides a predetermined logical level of said selected comparison result as said write enable signal to said failure data memory to put it in a write mode but which does not select said comparison result in said remove mode.

8. The failure analysis memory of claim 7, wherein said first memory control part further comprises second delay means which delays said address by a predetermined time interval to output a delayed address, and second delay multiplexer which selects said address provided thereto directly in said test mode and provides it to said failure data memory.

* * * * *